(12) United States Patent
He

(10) Patent No.: US 7,365,982 B2
(45) Date of Patent: Apr. 29, 2008

(54) LIQUID COOLING DEVICE

(75) Inventor: Li He, Shen-Zhen (CN)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 3 days.

(21) Appl. No.: 11/265,406

(22) Filed: Nov. 1, 2005

(65) Prior Publication Data

US 2007/0097640 A1  May 3, 2007

(51) Int. Cl.
- *H05K 5/00* (2006.01)
- *H05K 7/00* (2006.01)
- *H05K 7/20* (2006.01)
- *F28D 15/00* (2006.01)
- *H01B 7/42* (2006.01)

(52) U.S. Cl. .............. 361/700; 361/679; 361/688; 361/699; 165/104.21; 165/104.33; 174/15.2

(58) Field of Classification Search .......... 361/687, 361/683, 679, 700; 165/104.33, 104.19, 165/104.11, 104.21, 104.22, 104.31, 104.34; 174/15.1, 15.2

See application file for complete search history.

(56) References Cited

U.S. PATENT DOCUMENTS

| | | | |
|---|---|---|---|
| 2,499,736 A * | 3/1950 | Af Kleen .................. 62/59 |
| 3,986,550 A * | 10/1976 | Mitsuoka .............. 165/104.21 |
| 5,285,347 A | 2/1994 | Fox et al. |
| 5,380,956 A | 1/1995 | Loo et al. |
| 5,471,850 A * | 12/1995 | Cowans .................. 62/223 |
| 5,634,351 A * | 6/1997 | Larson et al. .......... 62/259.2 |
| 5,731,954 A * | 3/1998 | Cheon .................. 361/699 |
| 5,845,504 A * | 12/1998 | LeBleu .................. 62/92 |
| 6,062,299 A * | 5/2000 | Choo et al. ............... 165/46 |
| 6,234,240 B1 * | 5/2001 | Cheon .................. 165/80.3 |
| 6,257,323 B1 * | 7/2001 | Kuo .................... 165/104.21 |
| 6,313,990 B1 * | 11/2001 | Cheon .................. 361/699 |
| 6,697,253 B2 | 2/2004 | Minamitani et al. |
| 6,798,655 B2 * | 9/2004 | Nagashima et al. ......... 361/687 |
| 6,966,358 B2 * | 11/2005 | Rapaich .................. 165/80.4 |
| 7,028,757 B1 * | 4/2006 | Hegde .................. 165/104.21 |
| 7,176,564 B2 * | 2/2007 | Kim .................... 257/714 |
| 2002/0075642 A1 * | 6/2002 | Nagashima et al. ......... 361/687 |
| 2004/0042171 A1 * | 3/2004 | Takamatsu et al. ......... 361/687 |
| 2005/0007739 A1 * | 1/2005 | Hata et al. ............... 361/699 |
| 2005/0082158 A1 * | 4/2005 | Wenger .................. 202/155 |
| 2005/0161197 A1 * | 7/2005 | Rapaich .................. 165/80.4 |
| 2007/0044943 A1 * | 3/2007 | He et al. ................. 165/104.33 |

FOREIGN PATENT DOCUMENTS

| | | |
|---|---|---|
| TW | 200303718 | 9/2003 |
| TW | M249057 | 11/2004 |

* cited by examiner

*Primary Examiner*—Lisa Lea-Edmonds
*Assistant Examiner*—Anthony M Haughton
(74) *Attorney, Agent, or Firm*—Morris Manning Martin LLP; Tim Tingkang Xia, Esq.

(57) ABSTRACT

A liquid cooling device (10) includes a heat sink (12), a reservoir (14) containing liquid therein and distant from the heat sink, and a heat-transfer member. The heat-transfer member includes a heat-absorbing segment (162) contacting the heat sink and a heat-discharging segment (164) submerged in the liquid of the reservoir.

4 Claims, 3 Drawing Sheets

LIQUID COOLING DEVICE

BACKGROUND

1. Field

The present invention relates to a liquid cooling device, and more particularly to a liquid cooling device used to cool a heat-generating device mounted within a computer system.

2. Related Art

Boom of electronic technology promotes quick evolutions and rife applications of computers. Nowadays, personal computers are prevalently used in a variety of fields concerning study, work and life of human. A central processing unit (CPU) is a core of a computer system, as we know. Computers are ceaselessly updated to have the CPUs in higher frequency and higher speed. CPUs of these computers accordingly generate an increasing amount of heat which must be timely removed to enable the CPUs to retain stable operation.

Recently, some kinds of liquids are widely used as heat-transfer media contained in cooling devices to convey heat from one place to another place. Water is a preferred example of the kinds of liquids, because water has great specific heat and does not contaminate environment. Another reason for water being popular in liquid cooling system is that water has a low cost.

Taiwan Patent Issue No. 555073 disclosed a liquid cooling device. The cooling device comprises a heat absorbing box for containing liquid therein, a pump and pipes connecting the pump to the box to form a liquid circulation loop. A plurality of ribs is formed in the box to enhance heat-exchange between the liquid and the box. Unfortunately, the box itself is too small in volume to provide enough heat-exchange area. Additionally, most heat absorbed by the box is dissipated to environment by means of circulation of the liquid; thus, speed of the heat dissipation is restrained.

China Patent Issue No. 2612070 also taught a liquid cooling device. The cooling device provides a larger heat-exchange area in comparison with the cooling device disclosed in Taiwan Patent Issue No. 555073. However, the cooling device is heavy, and its weight is totally exerted to a printed circuit board on which the cooling device is positioned. The printed circuit board is subject to damage as a result of the overload of the cooling device.

Moreover, each of the cooling devices above-mentioned utilizes a pump to enhance the circulation of the liquid in the cooling devices. Pumps are expensive devices, and consume power when operate.

SUMMARY

Accordingly, what is needed is a liquid cooling device which is easily to be constructed at a low cost while the liquid cooling device can effectively remove heat from a heat-generating device.

A liquid cooling device in accordance with a preferred embodiment of the present invention comprises a heat sink, a reservoir containing liquid therein and distant from the heat sink and a heat-transfer member. The heat-transfer member comprises a heat-absorbing segment contacting the heat sink and a heat-discharging segment submerged in the liquid of the reservoir.

Other advantages and novel features will become more apparent from the following detailed description when taken in conjunction with the accompanying drawings, in which:

DETAILED DESCRIPTION OF THE PREFERRED EMBODIMENT

Figure 1:
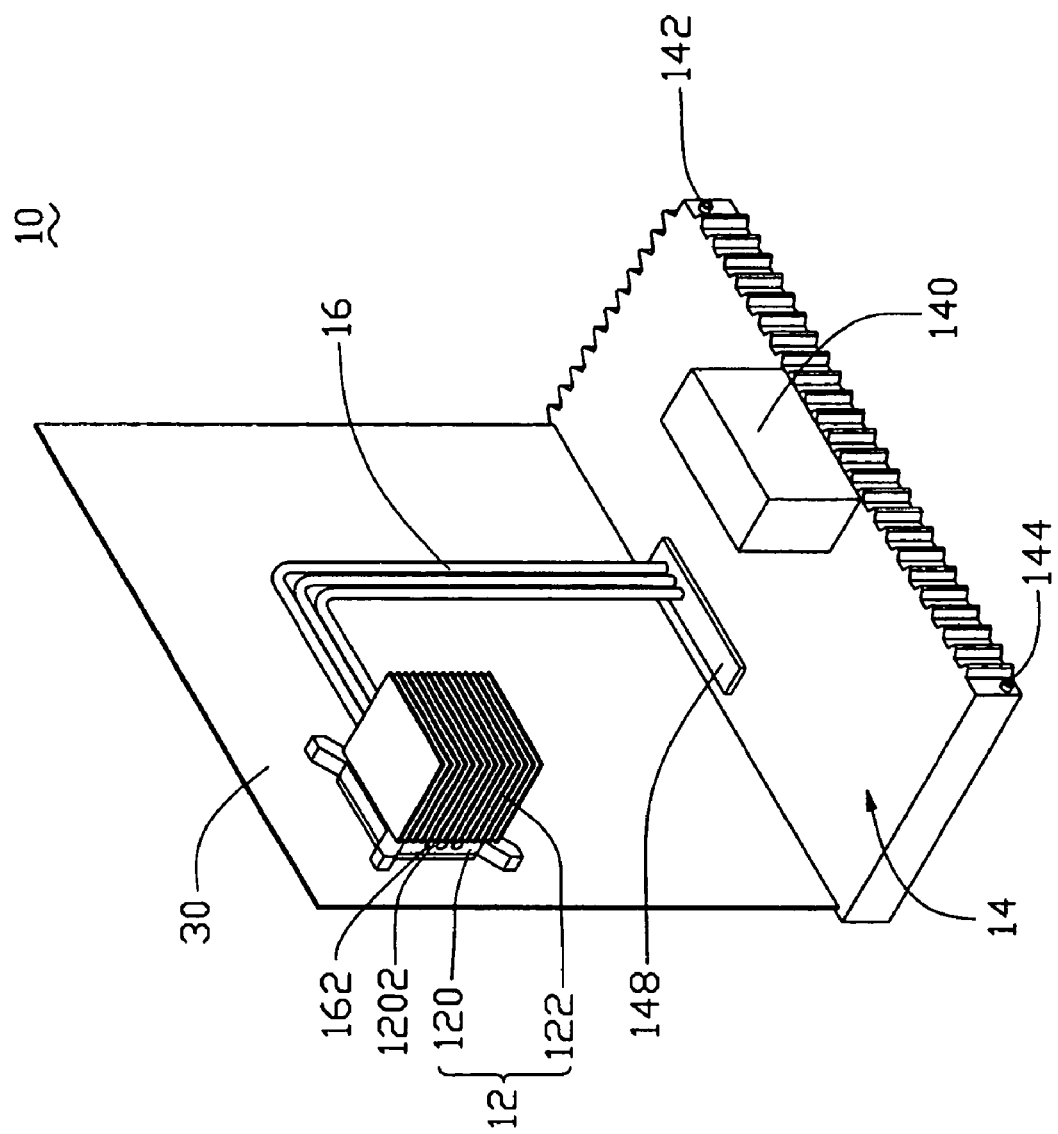
FIG. 1 is an assembled, isometric view of a liquid cooling device in accordance with a preferred embodiment of the present invention.
Figure 2:
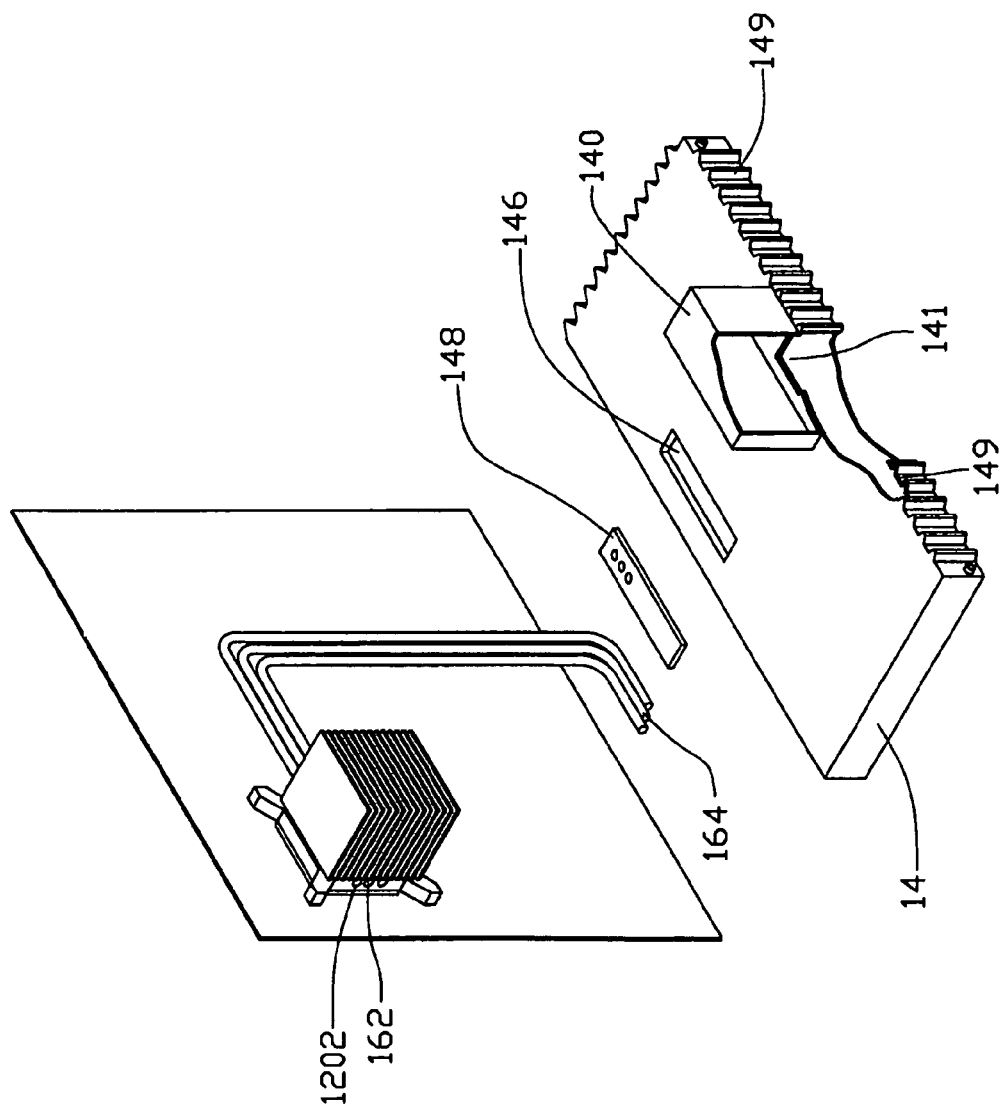
FIG. 2 is a partially exploded view of FIG. 1, and some parts being cut away to more clearly show an inner structure of a reservoir of FIG. 1 and connection between a tank and the reservoir.
Figure 3:
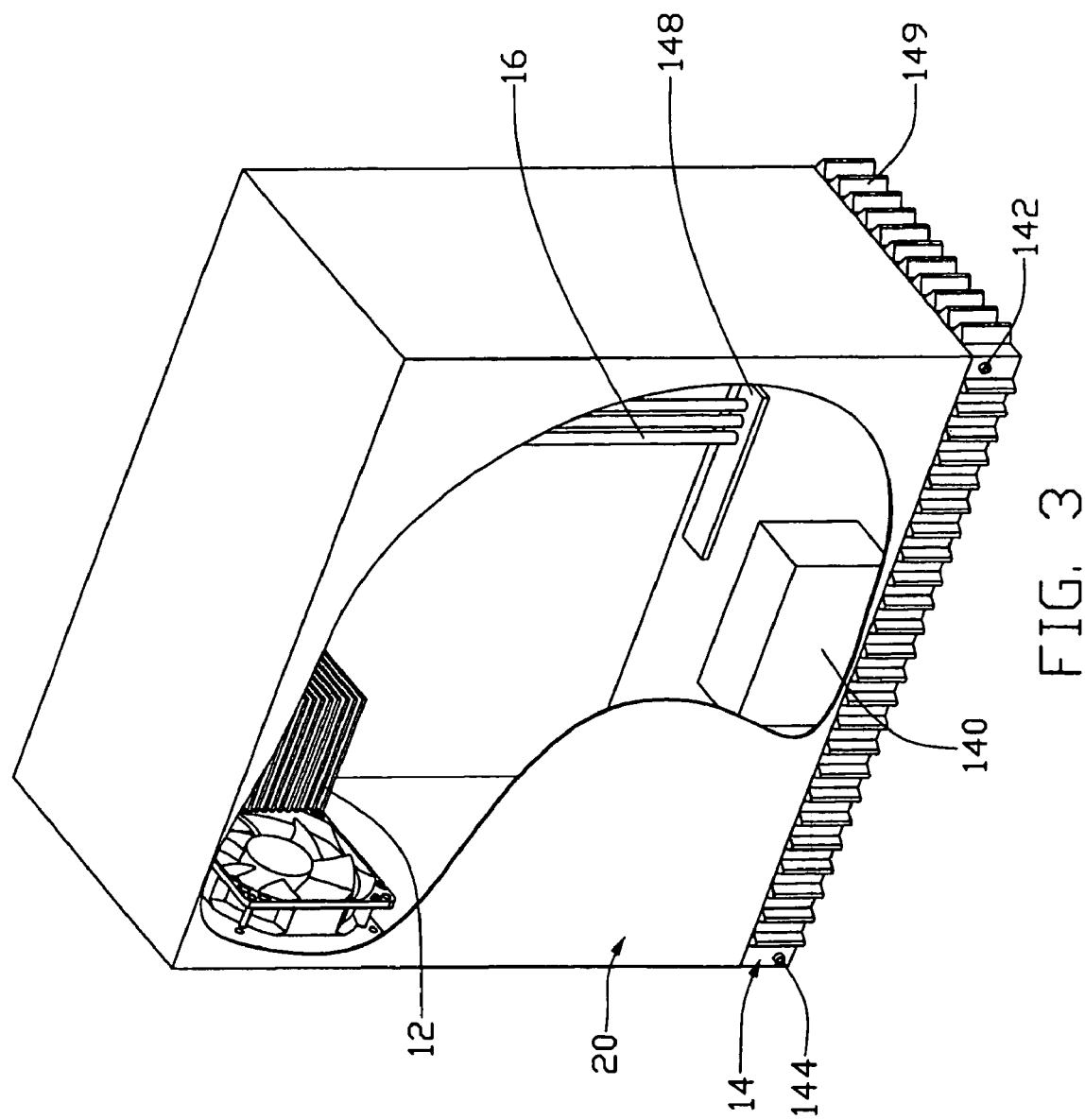
FIG. 3 is an isometric view of a use of the liquid cooling device of FIG. 1 to cool a heat-generating device in a computer casing wherein a part of the computer casing is cut away.

Referring to FIGS. 1-3, a liquid cooling device 10 of a preferred embodiment of the invention comprises a heat sink 12, a reservoir 14 distant from the heat sink 12, and a heat-transfer member. In the preferred embodiment, the heat-transfer member comprises three heat pipes 16. The heat transfer member can also be made of high heat conductive material, such as copper, brass, aluminum or Monel. In the preferred embodiment, the heat sink 12 functions as a heat-receiving element, and the reservoir 14 functions as a heat-dissipating element.

The heat sink 12 comprises a base 120 having a plurality of grooves 1202 defined therein and a plurality of fins 122 arranged on the base 120. The base 120 comprises an outer surface (not labeled) which is attachable to a heat-generating device (not labeled) mounted on a printed circuit board (PCB) 30 for absorbing heat from the heat-generating device.

The reservoir 14 is substantially in rectangular shape, and can contain a large volume of liquid, such as water, in the reservoir 14. In order to increase the volume of the reservoir 14, a tank 140 is disposed on a top surface of the reservoir 14 and hermetically communicated with the reservoir 14 via a through hole 141 between the reservoir 14 and the tank 140. The reservoir 14 comprises an inlet 142 for filling the reservoir 14 with liquid and an outlet 144 for discharging liquid out of the reservoir 14. The installation of the inlet 142 and the outlet 144 is for facilitating a person to move a computer incorporating the liquid cooling device 10 from one place to another place. The user can first discharge the liquid via the outlet 144 before moving the computer to a desired location, and fill the reservoir 14 and container 140 with liquid via the inlet 142 after the computer is moved to the desired location. A cutout 146 is defined in the top surface of the reservoir 14 to receive the heat pipes 16 into the reservoir 14. The cutout 146 is sealed up by a sealing element 148 after the heat pipes 16 are inserted into the reservoir 14 through three holes (not labeled) defined in the sealing element 148. The reservoir 14 forms a plurality of protrusions 149 on a portion of outer and inner peripheries of the reservoir 14 to enhance heat-exchange area of the reservoir 14 for the liquid therein and surrounding air, so that the reservoir 14 can sufficiently receive heat from the liquid contained therein and adequately dissipate the heat to the ambient environment. In the preferred embodiment, the reservoir 14 is located as a base for a computer casing 20 (particularly see in FIG. 3).

Each heat pipe 16 comprises an evaporating segment 162 (heat-absorbing segment) received in a corresponding groove 1202 of the base 120, and a condensing segment 164 (heat-discharging segment) submerged in the liquid of the reservoir 14.

In work of the liquid cooling device 10, the base 120 of the heat sink 12 absorbs heat from the heat-generating device. The heat-generating device in the preferred embodiment is an electronic device such as a CPU or an IC package. The heat absorbed by the base 120 is transferred to the fins 122 to be dissipated and the evaporating segments 162 of the heat pipes 16. The heat pipes 16 convey the heat to the condensing segments 164 distant from the heat-generating device. The condensing segments 164 discharge the heat to the liquid contained in the reservoir 14. The heat absorbed by the liquid contained in the reservoir 14 is further transferred to the ambient environment through the outer periphery and the protrusions 149 of the reservoir 14.

In the preferred embodiment, the liquid only needs to be positioned in the reservoir 14, without circulation through the liquid cooling device 10. Therefore, no great force is exerted on joints of different parts of the liquid cooling device 10 by the liquid. Accordingly, cost to seal the liquid cooling device 10 is low and the reliability of the sealing is high thereby ensuring the reliability of the liquid cooling device 10 as a whole. Additionally, no pump is needed to drive the liquid to circulate in the liquid cooling device 10. Thus, cost to provide a pump is eliminated. The liquid cooling device 10 consumes no electric power during operation thereof.

The protrusions 149 on the reservoir 14 enhance heat-exchange area between the reservoir 14 and the liquid, and prompt the reservoir 14 to dissipate heat to the ambient environment. The heat pipes 16 can quickly convey heat from a place near the heat-generating device to another place remote from the heat-generating device, and be cooled by the liquid in the reservoir 14. The liquid cooling device 10 can effectively remove heat from a heat-generating component.

Finally, in the preferred embodiment, only a minor part of weight of the liquid cooling device 10 is exerted to the heat-generating device which is usually mounted on the printed circuit board 30; thus, the printed circuit board 30 for mounting the heat-generating device is not subject to damage due to the weight of the liquid cooling device 10.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A computer comprising:
   a casing;
   a printed circuit board mounted in the casing;
   a heat-generating electronic device mounted on the printed circuit board; and
   a cooling device, comprising:
   a reservoir located at a base of the casing;
   cooling liquid filled in the reservoir;
   a heat sink attached on the heat-generating electronic device; and
   a heat pipe thermally connecting the cooling liquid and the heat sink;
   wherein the reservoir has a cutout, the cooling device further comprising a sealing element sealing the cutout, the heat pipe extending through the sealing element into the reservoir and immersed in the cooling liquid.

2. The computer of claim 1, further comprising a container located on and communicating with the reservoir, the cooling liquid also filling the container.

3. The computer of claim 1, wherein the reservoir has protrusions thereon for increasing contacting surface between the reservoir and the cooling liquid.

4. The computer of claim 1, wherein the reservoir has an inlet for filling the cooling liquid in the reservoir and an outlet for discharging the cooling liquid from the reservoir.

* * * * *